(12) United States Patent
Wang

(10) Patent No.: US 7,327,164 B2
(45) Date of Patent: Feb. 5, 2008

(54) INTERFACE CIRCUIT

(75) Inventor: Jianqin Wang, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 58 days.

(21) Appl. No.: 11/348,462

(22) Filed: Feb. 7, 2006

(65) Prior Publication Data
US 2006/0186923 A1    Aug. 24, 2006

(30) Foreign Application Priority Data
Feb. 10, 2005    (JP) .............................. 2005-034579

(51) Int. Cl.
*H03K 19/082* (2006.01)
*H03K 19/0175* (2006.01)
(52) U.S. Cl. .............................. 326/77; 326/66; 326/73
(58) Field of Classification Search .................. 326/66, 326/69, 73, 75, 77, 126
See application file for complete search history.

(56) References Cited

U.S. PATENT DOCUMENTS 5,528,171 A * 6/1996 Doi et al. ...................... 326/66

6,480,069 B2 * 11/2002 Yasukouchi .................. 330/288

FOREIGN PATENT DOCUMENTS

JP    6-204844    7/1994

* cited by examiner

*Primary Examiner*—Anh Q. Tran
(74) *Attorney, Agent, or Firm*—McGinn IP Law Group, PLLC

(57) ABSTRACT

An interface circuit includes a first and a second input terminal, a first output transistor, a second output transistor, a first output controller for implementing control according to a voltage supplied to the first and the second input terminal so that a predetermined current appears at a control terminal of the first output transistor if the first output transistor is in saturated state and supplies a predetermined current to the control terminal of the first output transistor if the first output transistor is in shutoff state, and a second output controller for implementing control according to a voltage supplied to the first and the second input terminal so that a predetermined current appears at a control terminal of the second output transistor if the second output transistor is in saturated state and supplies a predetermined current to the control terminal of the second output transistor if the second output transistor is in shutoff state.

20 Claims, 8 Drawing Sheets

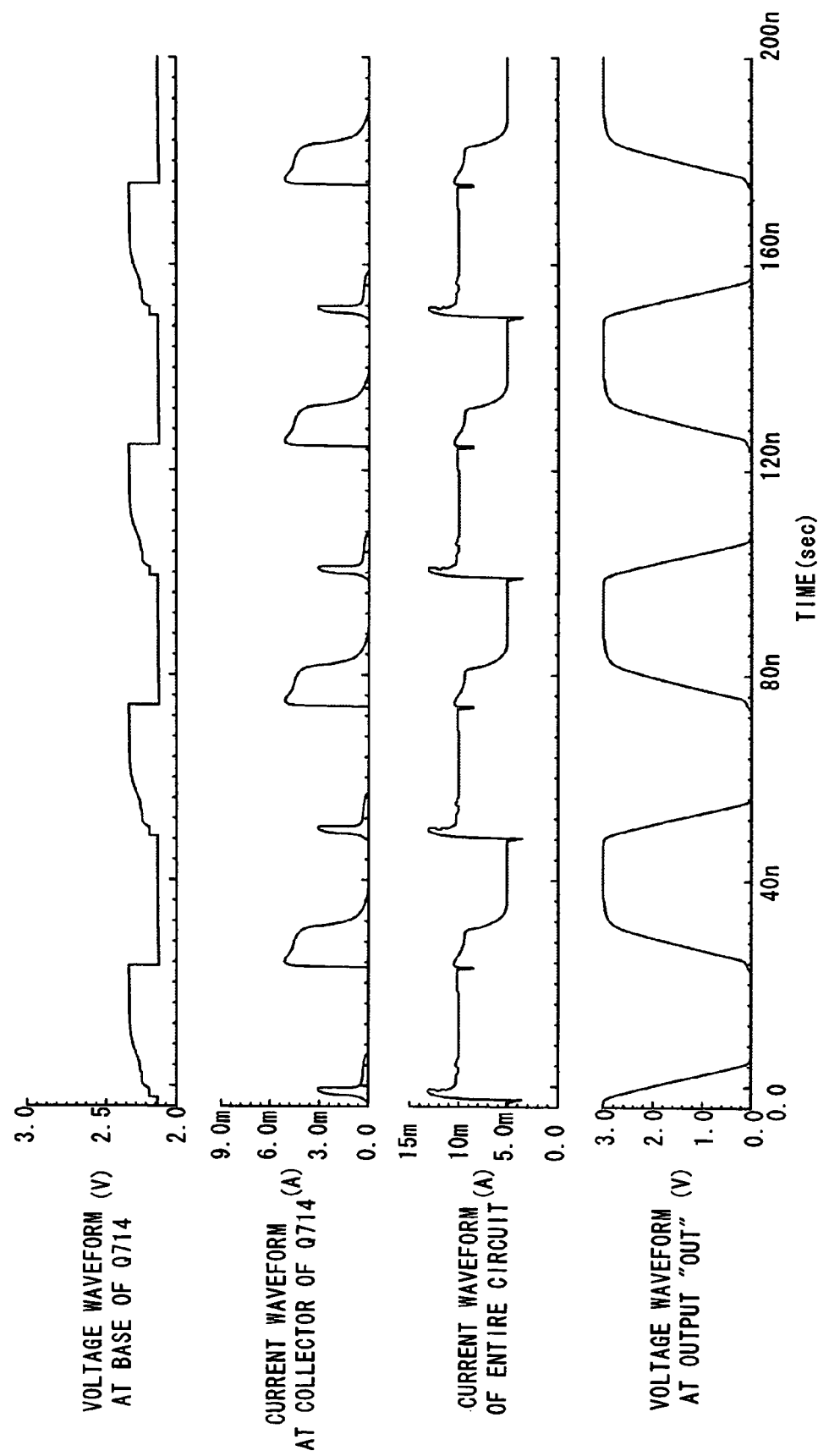

US 7,327,164 B2

INTERFACE CIRCUIT

BACKGROUND OF THE INVENTION

1. Field of the Invention

The present invention relates to an interface circuit and, particularly, to an interface circuit that changes a signal level used for a high-speed A/D converter or the like, which is particularly used in a wireless communication system.

2. Description of Related Art

In a wireless communication system such as Global Positioning System (GPS) receiver, an internal system is largely classified into a high-frequency analog signal processor and a low-frequency baseband digital signal processor. The high-frequency analog signal processor uses a low amplitude signal at Emitter Coupled Logic (ECL) level, for example, in order to perform high-speed signal processing. On the other hand, the low-frequency baseband digital signal processor performs signal processing at high amplitude Complimentary Metal Oxide Semiconductor (CMOS) level. Since there are two signal levels in one system, a wireless communication system needs to have an interface circuit for converting signal levels in order to process different levels of signals. Further, a capacitive load such as a gate of a CMOS transistor is connected to the subsequent stage of the interface circuit. In order to achieve the high-speed signal processing, the interface circuit needs to have such a current output capacity as to charge the capacitive load quickly.

To meet these needs, interface circuits often use Bipolar-Complimentary Metal Oxide Semiconductor (BiCMOS) process. An interface circuit that uses the BiCMOS process is disclosed in Japanese Unexamined Patent Application Publication No. 06-204844. Recently, there are increasing demands on GPS receivers or the like for size reduction, cost reduction, sensitivity increase and power consumption reduction. To meet the demands for size reduction, an interface circuit tends to be incorporated into a high-frequency integrated circuit (IC) that processes a high-frequency analog signal. To meet the cost reduction and sensitivity increase, a manufacturing process of a high-frequency IC employs a bipolar process. Thus, it is required to configure an interface circuit with low power consumption by using the bipolar process.

FIG. 7 shows a circuit diagram of a normal conventional interface circuit in a bipolar process. The interface circuit 700 of FIG. 7 is capable of converting an ECL level signal into a CMOS level signal. However, the conventional interface circuit needs to set the current to charge a capacitance load with the current to be supplied to an input stage. It is thus possible to supply a large current to the input stage, which causes an increase in current consumption of the entire circuit. Further, in the conventional interface circuit, a PNP transistor and an NPN transistor are connected between a power supply VCC and a ground GND and a signal is output from a node between the two transistors. An output signal has an amplitude that substantially ranges from a power supply voltage VCC to a ground voltage GND.

FIG. 8 are graphs of the base voltage waveform of the PNP transistor Q714, the collector current waveform of the PNP transistor Q714, the current waveform of the entire circuit and the voltage waveform at the output OUT in the interface circuit 700. FIG. 8 shows that a through current flows through the collector of the PNP transistor Q714 at the falling edges of an output signal in the conventional interface circuit 700. The through current flows because the NPN transistor Q718 switches from the shutoff state to the saturated state before the PNP transistor Q714 switches from the saturated state to the complete shutoff state. The PNP transistor Q714 switches between the saturated state and the shutoff state depending on its base voltage. The base voltage of the PNP transistor Q714 is determined by the current flowing through the PNP transistor Q713. However, the current flowing through the PNP transistor Q713 changes from a predetermined current amount to zero when the PNP transistor Q714 switches from the saturated state to the shutoff state. Since no current flows to the PNP transistor Q713, the base voltage of the PNP transistor Q714 becomes unstable. Therefore, the PNP transistor Q714 cannot switch from the saturated state to the shutoff state immediately. As a result, the conventional interface circuit 700 has a problem that a through current flows in when the PNP transistor Q714 switches from the saturated state to the shutoff state, which hinders the achievement of higher signal level conversion speed.

SUMMARY OF THE INVENTION

According to an aspect of the present invention, there is provided an interface circuit that includes a first and a second input terminal, a first output transistor, a second output transistor, a first output controller for implementing control according to a voltage supplied to the first and the second input terminal so that a predetermined current appears at a control terminal of the first output transistor if the first output transistor is in saturated state and supplies a predetermined current to the control terminal of the first output transistor if the first output transistor is in shutoff state, and a second output controller for implementing control according to a voltage supplied to the first and the second input terminal so that a predetermined current appears at a control terminal of the second output transistor if the second output transistor is in saturated state and supplies a predetermined current to the control terminal of the second output transistor if the second output transistor is in shutoff state.

The present invention allows smooth switching of the output transistor between saturated state and shutoff stage by an output controller that controls the base of the output transistor. Further, it allows effective use of the current amplification of the output transistor. Specifically, the current that is required for the circuit operation is only a value divided by the amplification factor of output current. It is thereby possible to achieve high sensitivity and high speed signal level conversion with low power consumption.

BRIEF DESCRIPTION OF THE DRAWINGS

The above and other objects, advantages and features of the present invention will be more apparent from the following description taken in conjunction with the accompanying drawings, in which:

FIG. 8 shows graphs of the base voltage of a transistor Q714, the collector current of a transistor Q714, the current waveform of the entire circuit and the voltage waveform of an output OUT in the conventional interface circuit.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
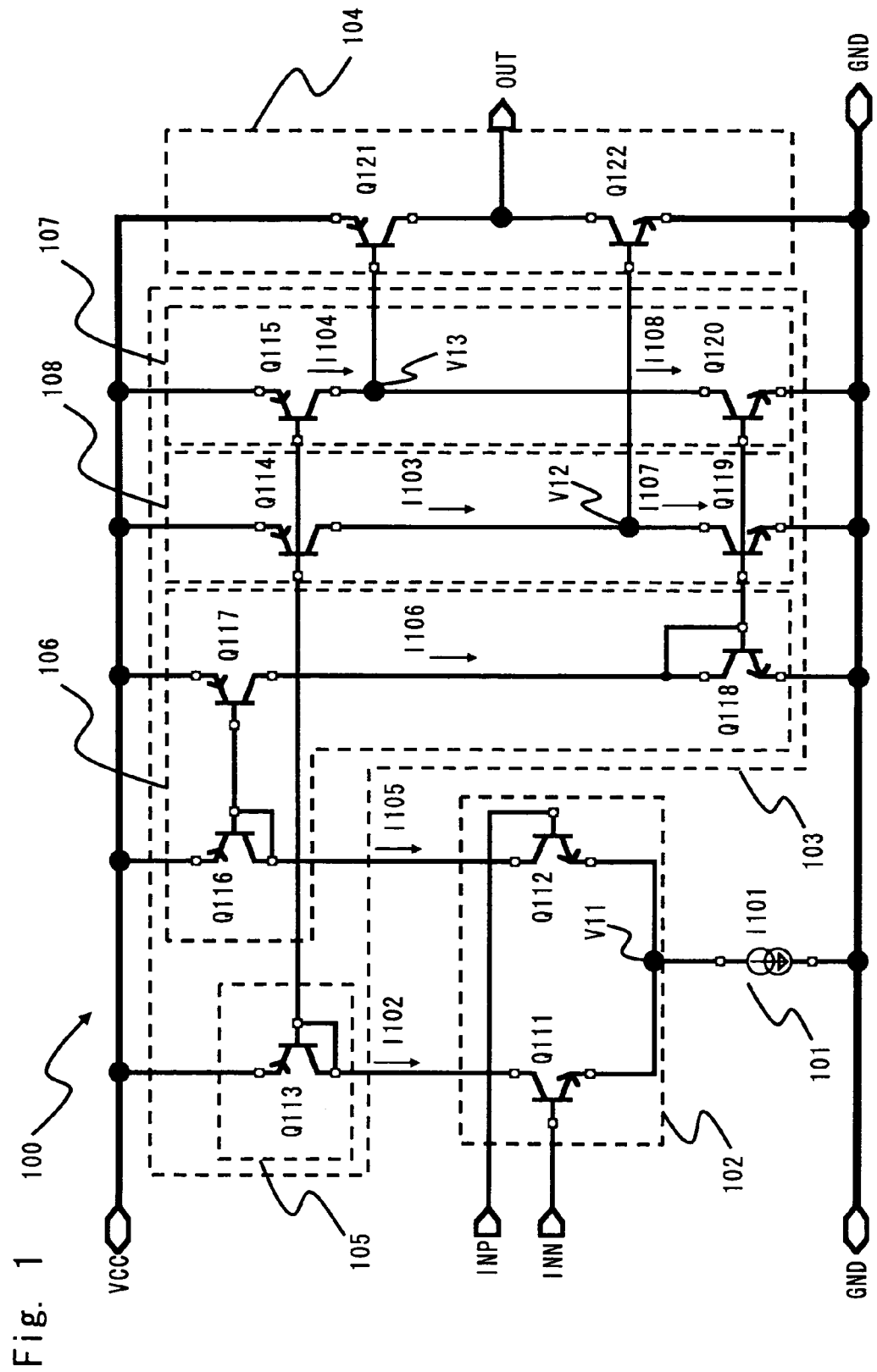
FIG. 1 is a circuit diagram showing an interface circuit according to a first embodiment of the invention.

FIG. 1 is a circuit diagram of an interface circuit 100 according to a first embodiment of the present invention. The interface circuit 100 of the first embodiment includes input terminals INN and INP, an output terminal OUT, a current source 101, an input stage 102, a controller 103, and an output stage 104.

The input stage 102 has a first and a second input terminal. The first input terminal is connected to the input terminal INN, and the second input terminal is connected to the input terminal INP. The current source 101 is connected between the input stage 102 and the ground GND. The input stage 102 has a first and a second output terminal. The controller 103 has a first and a second input terminal and a first and a second output terminal. The first and the second input terminal of the controller 103 are respectively connected to the first and the second output terminal of the input stage 102. The output stage 104 has a first and a second input terminal and an output terminal. The first and the second input terminal of the output stage 104 are respectively connected to the first and the second output terminal of the controller 103. The output terminal of the output stage 104 is connected to the output terminal OUT of the interface circuit 100.

In the interface circuit 100, the input stage 102 outputs current through the first and the second output terminal according to signals input through the input terminals INP and INN. According to the output current, the controller 103 generates a control signal for controlling the output stage 104. The output stage 104 outputs an output signal according to the control signal.

The connection of the controller 103 is described below. The controller 103 includes a first voltage generator 105, a second voltage generator 106, a first output controller 107, and a second output controller 108.

The first voltage generator 105 has an input terminal and an output terminal. The input terminal is connected to the first output terminal of the input stage 102. The output terminal of the first generator 105 is connected to the first input terminals of the output controllers 107 and 108, respectively.

The second voltage generator 106 has an input terminal and an output terminal. The input terminal is connected to the second output terminal of the input stage 102. The output terminal of the second generator 106 is connected to the second input terminals of the output controllers 107 and 108, respectively.

The output stage 104 has a first and a second input terminal and an output terminal. The first input terminal of the output stage 104 is connected to the output terminal of the first output controller 107. The second input terminal of the output stage 104 is connected to the output terminal of the second output controller 108. The output terminal of the output stage 104 serves as the output of the interface circuit 100, to which the output terminal OUT is connected.

The connection of the components of each block is described below.

The input stage 102 includes NPN transistors Q111 and Q112. The emitter of the NPN transistor Q111 and the emitter of the NPN transistor Q112 are connected by a node V11. The current source 101 for allowing the interface circuit 100 to operate is connected between the node V11 and the first power supply (for example, the ground GND) The current source 101 supplies current I101. The base of the NPN transistor Q111 serves as the first input terminal, to which the input terminal INN is connected. The collector of the NPN transistor Q111 serves as the first output terminal of the input stage 102, which outputs current I102 according to the input INN. The base of the NPN transistor Q112 serves as the second input terminal, to which the input terminal INP is connected. The collector of the NPN transistor Q112 serves as the second output terminal of the input stage 102, which outputs current I105 according to the input INP.

The first voltage generator 105 includes a PNP transistor Q113. The PNP transistor Q113 has a base and a collector connected to each other. The collector is connected to the first output terminal of the input stage 102. The emitter of the PNP transistor Q113 is connected to a second power supply, which is a power supply VCC, for example. The collector and the base of the PNP transistor Q113 respectively serve as the input terminal and the output terminal of the first voltage generator 105. According to the current I102 input through the first output terminal of the input stage 102, the first voltage generator 105 outputs through its base a voltage that is a result of subtracting a threshold voltage of the PNP transistor Q113 from the power supply voltage VCC.

The second voltage generator 106 includes PNP transistors Q116 and Q117 and an NPN transistor Q118. The PNP transistor Q116 has a base and a collector connected to each other and an emitter connected to the power supply VCC. The collector of the PNP transistor Q116 serves as the input terminal of the second voltage generator 106 and is connected to the second output terminal of the input stage 102. The PNP transistor Q117 has a base connected to the base of the PNP transistor Q116 and an emitter connected to the power supply VCC. The collector of the PNP transistor Q117 is connected to the collector of the NPN transistor Q118. Thus, the PNP transistors Q116 and Q117 form a current mirror. The NPN transistor Q118 has a base connected to its collector and an emitter connected to the ground GND. The base of the NPN transistor Q118 serves as the output of the second voltage generator 106. The second voltage generator 106 outputs a threshold voltage of the NPN transistor Q118 that is generated by current I106, which is returning current of the current I105 that has been input through the second output terminal of the input stage 102 by the current mirror of the PNP transistors Q116 and Q117.

The first output controller 107 includes a PNP transistor Q115 and an NPN transistor Q120 that are connected serially between the power supply VCC and the ground GND. The emitter of the PNP transistor Q115 is connected to the power supply VCC. The first input terminal of the first output controller 107 is the base of the PNP transistor Q115, which is connected to the output terminal of the first voltage generator 105. An emitter-base voltage of the PNP transistor Q115 is substantially the same as an emitter-base voltage of the PNP transistor Q113 of the first voltage generator 105, and the PNP transistor Q115 outputs current I104 that is substantially the same as the current I102 through its collector. The emitter of the NPN transistor Q120 is connected to the ground GND. The second input terminal of the first output controller 107 is the base of the NPN transistor Q120, which is connected to the output terminal of the second voltage generator 106. An emitter-base voltage of the NPN transistor Q120 is substantially the same as an emitter-base voltage of the NPN transistor Q118 of the second voltage generator 106, and the NPN transistor Q120 outputs current I108 that is substantially the same as the current I106 through its collector. In the first output controller 107, the collector of the PNP transistor Q115 and the collector of the NPN transistor Q120 are connected to each other by a node V13. The first output controller 107 outputs current that is a result of subtracting the current I108 from the current I104 through the node V13.

The second output controller 108 includes a PNP transistor Q114 and an NPN transistor Q119 that are connected serially between the power supply VCC and the ground GND. The emitter of the PNP transistor Q114 is connected to the power supply VCC. The first input terminal of the second output controller 108 is the base of the PNP transistor Q114, which is connected to the output terminal of the first voltage generator 105. An emitter-base voltage of the PNP transistor Q114 is substantially the same as an emitter-base voltage of the PNP transistor Q113 of the first voltage generator 105, and the PNP transistor Q114 outputs current I103 that is substantially the same as the current I102 through its collector. The emitter of the NPN transistor Q119 is connected to the ground GND. The second input terminal of the second output controller 108 is the base of the NPN transistor Q119, which is connected to the output terminal of the second voltage generator 106. An emitter-base voltage of the NPN transistor Q119 is substantially the same as an emitter-base voltage of the NPN transistor Q118 of the second voltage generator 106, and the NPN transistor Q119 outputs current I107 that is substantially the same as the current I106 through its collector. In the second output controller 108, the collector of the PNP transistor Q114 and the collector of the NPN transistor Q119 are connected to each other by a node V12. The second output controller 108 outputs current that is a result of subtracting the current I107 from the current I103 through the node V12.

The output stage 104 includes a PNP transistor Q121 and an NPN transistor Q122 that are connected serially between the power supply VCC and the ground GND. The emitter of the PNP transistor Q121 is connected to the power supply VCC. The base of the PNP transistor Q121 serves as the first input terminal of the output stage 104 and connected to the output terminal of the first output controller 107. The emitter of the NPN transistor Q122 is connected to the ground GND. The base of the NPN transistor Q122 serves as the second input terminal of the output stage 104 and connected to the output terminal of the second output controller 108. The collector of the PNP transistor Q121 and the collector of the NPN transistor Q122 are connected to each other, and a node between them serves as the output of the interface circuit 100, which is connected to the output terminal OUT.

The operation of the interface circuit 100 according to the first embodiment is described hereinafter in detail. The interface circuit 100 converts an ECL level signal into a CMOS level signal, for example. The ECL level signal is a differential signal that has an amplitude ranging from +0.4V to −0.4V for a predetermined voltage, where two signals operate in opposite phase. The CMOS level signal is a rectangular wave signal that has an amplitude ranging from a power supply voltage VCC to a ground voltage GND.

Figure 2:
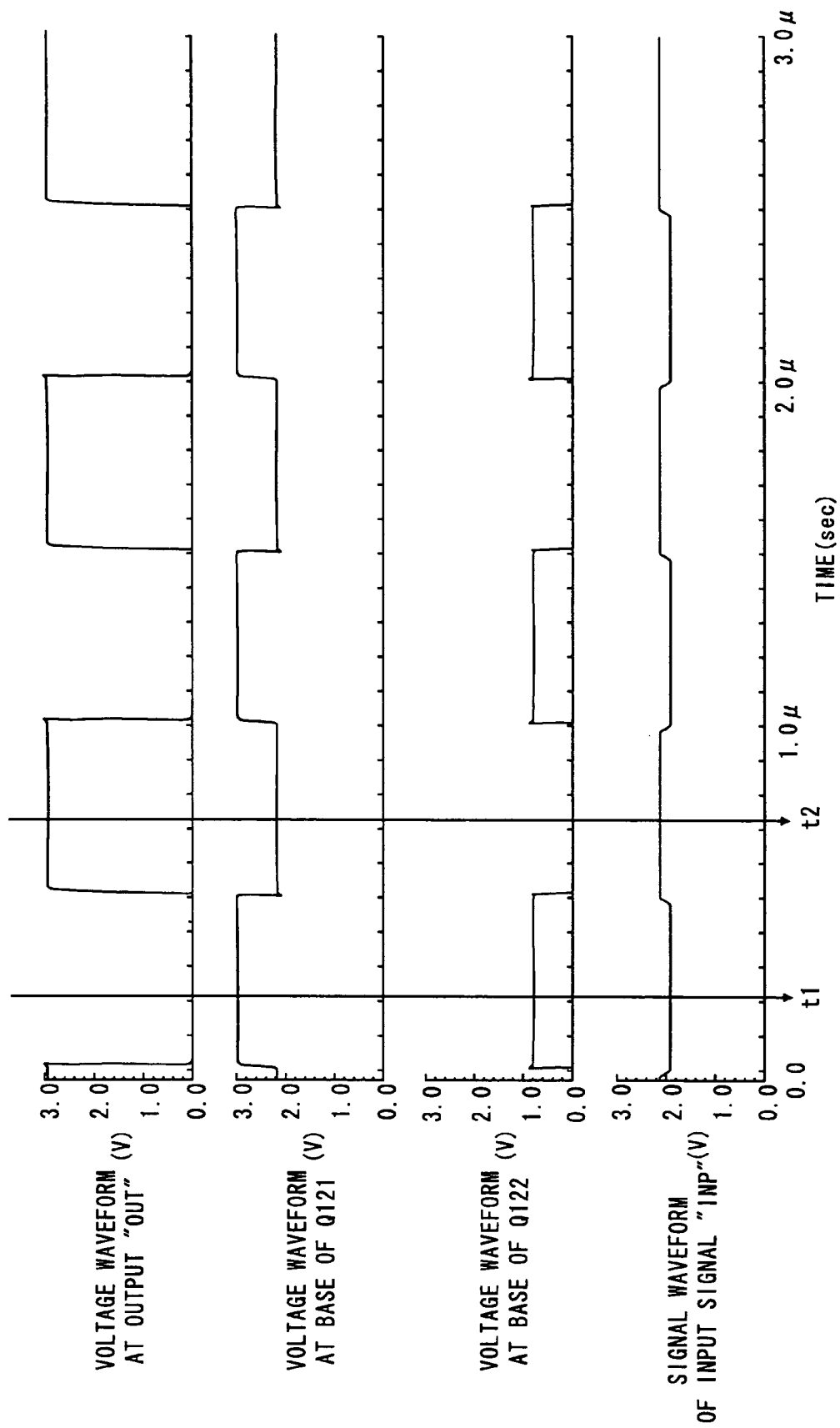
FIG. 2 shows graphs of the input and output signals and the base voltages of transistors Q121 and Q122 in the interface circuit according to the first embodiment of the invention.

FIG. 2 shows the waveforms of the input signal INP and the output signal of the interface circuit 100 of the first embodiment. The operation of the interface circuit 100 of the first embodiment is described hereinafter with reference to FIG. 2. The input signal INN is an inverted signal of the input signal INP.

The NPN transistor used herein has base, collector and emitter terminals, and current of (Nhfe−1) times greater than the current flowing into the base flows between the collector and emitter. Nhfe is a predetermined coefficient of an element, and it is a current amplification factor of the NPN transistor. On the other hand, the PNP transistor used herein has base, collector and emitter terminals, and current of (Phfe−1) times greater than the current flowing out from the base flows between the collector and emitter. Phfe is a predetermined coefficient of an element, and it is a current amplification factor of the PNP transistor. The operation of the interface circuit 100 under these conditions is detailed below.

At the timing t1, an input signal INN of ECL-Low level (e.g. 1.6V) is input to the input terminal INN. Further, an input signal INP of ECL-High level (e.g. 2.4V) is input to the input terminal INP. At this time, the NPN transistor Q111 is in shutdown state where no current flows therethrough while the NPN transistor Q112 is in saturated state where current flows therethrough. Since the NPN transistor Q111 is in the shutdown state, a greater part of the current I101 from the current source 101 flows through the NPN transistor Q112. Thus, the current I105 that flows through the NPN transistor Q112 and the PNP transistor Q116 is substantially the same as the current 101. As described earlier, the current of substantially the same amount as the current I105 flows as the current I106, I107 and I108.

At this time, the current I102 to flow through the PNP transistor Q113 that is connected to the NPN transistor Q113 in shutdown state is substantially zero. As described earlier, the current of substantially the same amount as the current I102 flows as the current I103 and I104. Thus, the current I103 and I104 is substantially zero.

The PNP transistor Q114 and the NPN transistor Q119 are connected to each other. Since the current I108 is substantially zero, no current is supplied to the base of the NPN transistor Q122 that is connected to the node V12. At this time, since the NPN transistor Q119 is in saturated state, the collector-emitter voltage drops and the collector voltage becomes close to the ground voltage GND. Thus, the voltage at the node V12 becomes close to the ground voltage GND. The voltage difference between the base and the emitter of the NPN transistor Q122 thereby becomes substantially zero, and the NPN transistor Q122 therefore becomes the shutoff state.

Further, the PNP transistor Q115 and the NPN transistor Q120 are connected to each other. Since the current I104 is substantially zero, the current corresponding to the current I108 is supplied to the base of the PNP transistor Q121 that is connected to the node V13. At this time, current of (Phfe−1) times greater than the current I108 flows to the PNP transistor Q121. Thus, the PNP transistor Q121 becomes the saturated state and its collector voltage increases to be substantially equal to the power supply voltage. The output OUT thereby becomes at CMOS-High level (e.g. the power supply voltage VCC).

At the timing t2, an input signal INN of ECL-High level (e.g. 2.4V) is input to the input terminal INN. Further, an input signal INP of ECL-Low level (e.g. 1.6V) is input to the input terminal INP. At this time, the NPN transistor Q111 is in the saturated state where current flows therethrough while the NPN transistor Q112 is in the shutdown state where no current flows therethrough. Since the NPN transistor Q111 is in the saturated state, all of the current I101 from the current source 101 flows through the NPN transistor Q111. Thus, the current I102 that flows through the NPN transistor Q111 and the PNP transistor Q113 is substantially the same as the current I01. As described earlier, the current of substantially the same amount as the current I102 flows as the current I103 and I104.

At this time, the current I105 to flow through the PNP transistor Q116 that is connected to the NPN transistor Q112 in the shutdown state is substantially zero. As described earlier, the current of substantially the same amount as the current I105 flows as the current I106, I107 and I108. Thus, the current I106, I107 and I108 is substantially zero.

The PNP transistor Q114 and the NPN transistor Q119 are connected to each other. Since the current I107 is substantially zero, the current corresponding to the current I103 is supplied to the base of the NPN transistor Q122 that is connected to the node V12. At this time, the base voltage of the NPN transistor 122 increases to reach a threshold voltage of the NPN transistor Q122. Thus, the voltage at the node V12 becomes the threshold voltage of the NPN transistor Q122. The voltage difference between the base and the emitter of the NPN transistor Q122 thereby equals the threshold voltage of the NPN transistor Q122, and the NPN transistor Q122 therefore becomes the saturated state and the current of (Phfe−1) times greater than the current I103 flows therethrough.

Further, the PNP transistor Q115 and the NPN transistor Q120 are connected to each other. Since the current I108 is substantially zero, no current flows out from the base of the PMP transistor Q121 that is connected to the node V13. At this time, since the NPN transistor Q115 is in saturated state, the collector-emitter voltage increases and the collector voltage becomes close to the power supply voltage VCC. Thus, the voltage at the node V13 becomes close to the power supply voltage VCC. The voltage difference between the base and the emitter of the PNP transistor Q121 thereby becomes substantially zero, and the PNP transistor Q121 therefore becomes the shutoff state. The output OUT thereby becomes at CMOS-Low level (e.g. the ground voltage GND).

During the period from the timing t1 to t2, there is a timing when the level of the ECL level signal is inverted. At this time, the current supplied to the bases of the two transistors Q121 and Q122 in the output stage switches smoothly from flow-in to flow-out. Thus, the base voltage of the transistors Q121 and Q122 does not becomes indeterminate voltage and the transistors switches smoothly between the saturated state and the shutoff state. Thus, through current does not flows in the switching of ECL level signals and no delay occurs in signal switching.

As described earlier, the interface circuit 100 of the first embodiment converts the ECL level signal into the CMOS level signal at high speed. The interface circuit 100 of the first embodiment controls the PNP transistor Q121 and the NPN transistor Q122 of the output stage 104 according to the flow-in or flow-out of the current from the first output controller 107 and the second output controller 108, respectively. The bases of the two transistors of the output stage thereby do not become voltage indeterminate state, and therefore in no case the two transistors are in the saturated state at the same time upon switching of signals. Thus, through current does not flow through the output stage 104, thereby allowing high-speed signal switching.

Figure 3:
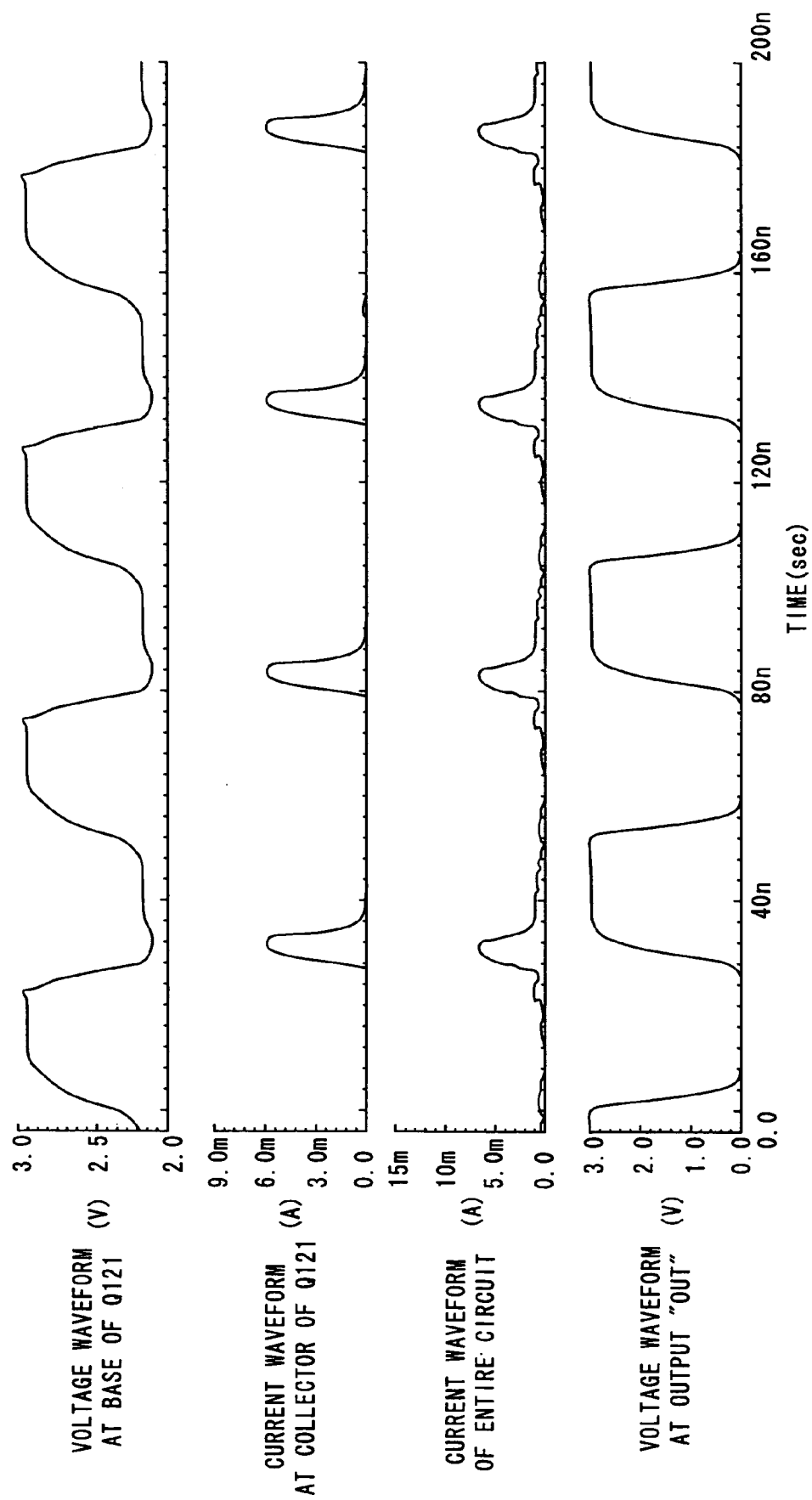
FIG. 3 shows graphs of the base voltage of the transistor Q121, the collector current of the transistor Q121, the current waveform of the entire circuit and the voltage waveform of an output OUT in the interface circuit according to the first embodiment of the invention.

FIG. 3 shows the graphs of the base voltage waveform of the PNP transistor Q121, the collector current waveform of the PNP transistor Q121, the current waveform of the entire circuit, and the voltage waveform of the output OUT. As shown in FIG. 3, the base voltage of the PNP transistor Q121 switches smoothly, and the collector current of the PNP transistor Q121 flows only at the rising edge of the output signal. The current of the entire circuit becomes large also only at the rising edge of the output signal, and the circuit current flowing in other times is small.

The set value of the current I101 from the current source 101 to be supplied to the input stage 102 may be the value that is 1/(Phfe−1) of the current to charge the capacitive load that is connected to the subsequent stage of the interface circuit 100. Generally, a current amplification factor is smaller in a PNP transistor than in an NPN transistor. Thus, if the first output controller 107 can generate the current that is flowing out from the base of the PNP transistor, the output stage can have enough current supply capacity to charge the capacitive load that is connected to the output. Reducing the current I101 from the current source 101 allows reducing the current value consumed in the entire interface circuit 100. This enables to produce the interface circuit that is capable of high-speed signal switching while operating at low-power consumption.

Second Embodiment

Figure 4:
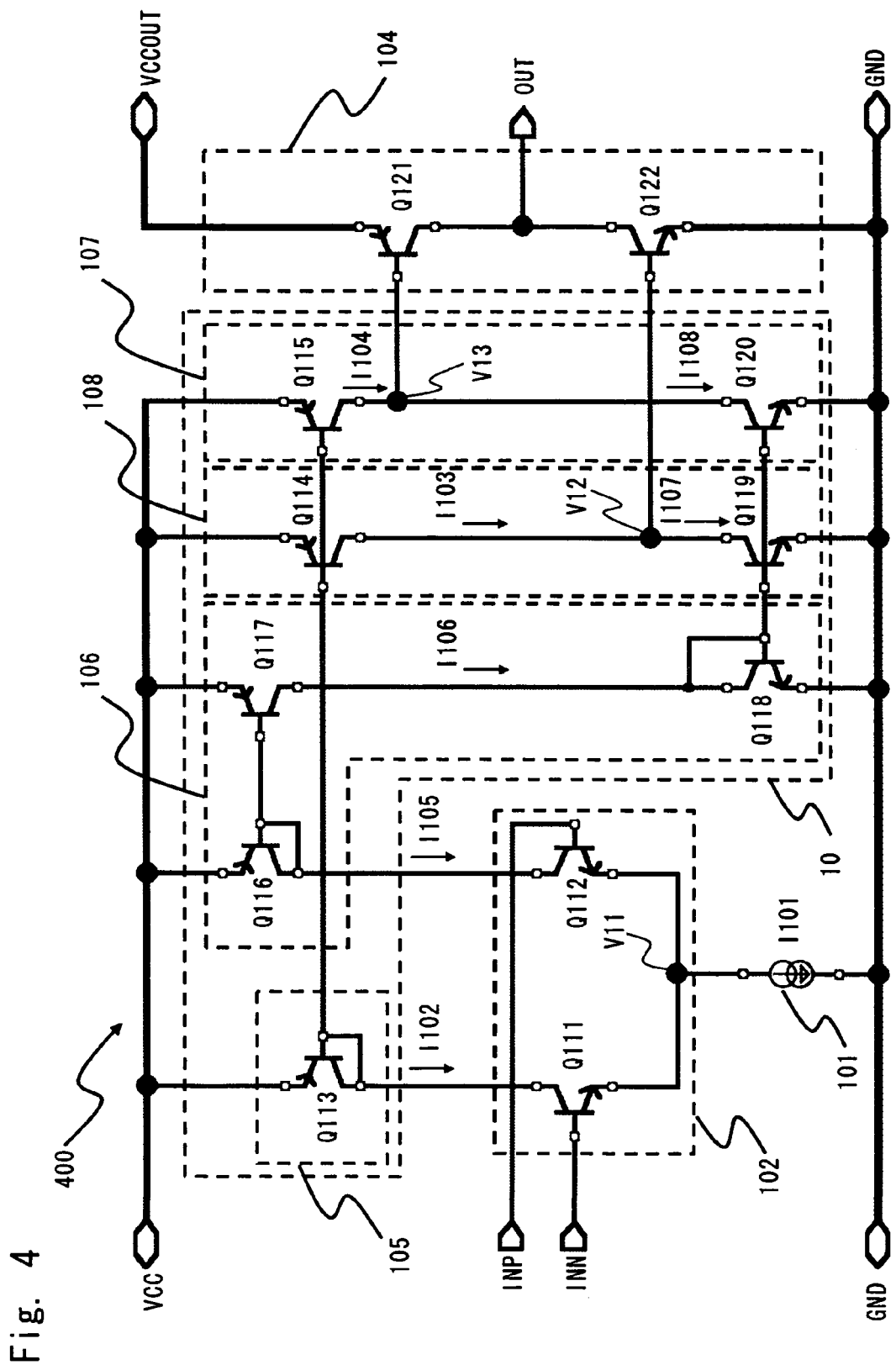
FIG. 4 is a circuit diagram showing an interface circuit according to a second embodiment of the invention.

FIG. 4 is a circuit diagram of an interface circuit 400 according to a second embodiment of the present invention. The interface circuit 400 of the second embodiment has substantially the same configuration as the interface circuit 100 of the first embodiment. A difference is that while the interface circuit 100 of the first embodiment has circuits between the first power supply and the second power supply, the interface circuit 400 of the second embodiment has circuits between the first power supply and the second power supply or the third power supply. The elements that are substantially the same as those in the first embodiment are denoted by the same reference numerals and not described in detail herein.

In the interface circuit 400 of the second embodiment, a power supply that is connected to the output stage 104 is different from the one in the other blocks. Specifically, the other blocks are supplied with the second power supply voltage (e.g. power supply voltage VCC) just like in the first embodiment. On the other hand, the output stage 104 is supplied with a third power supply voltage that is different from the power supply voltage VCC. The third power supply voltage may be a power supply voltage of a unit connected to the subsequent stage of the interface circuit, for example, and may be set to an arbitrary value as long as it is equal to or higher than High level of the output signal. In the second embodiment, the third power supply voltage is referred to as output power supply voltage VCCOUT. The output power supply voltage VCCOUT is a voltage that is High level of the CMOS level signal (CMOS-VCC), for example.

The operation of the interface circuit 400 of the second embodiment is substantially the same as that of the first embodiment and thus not detailed herein.

In the interface circuit 400 of the second embodiment, the output stage 104 operates with a different voltage from the other blocks. Thus, even if the voltage level to be output from the interface circuit is different from the power supply voltage VCC with which the interface circuit operates, it is possible to convert signal levels correctly to obtain a correct output signal. Specifically, the interface circuit 400 of the second embodiment sets the first voltage of the output stage to substantially the same signal level as the output, thereby producing an interface circuit with a wide set range of output signal level. For example, when a circuit block that operates with power supply voltage of 1.8V is connected to the subsequent stage of the interface circuit, the interface circuit can supply an appropriate signal to the circuit block of the subsequent stage if it operates with power supply voltage VCC and the output power supply voltage VCCOUT is set to 1.8V.

Third Embodiment

Figure 5:
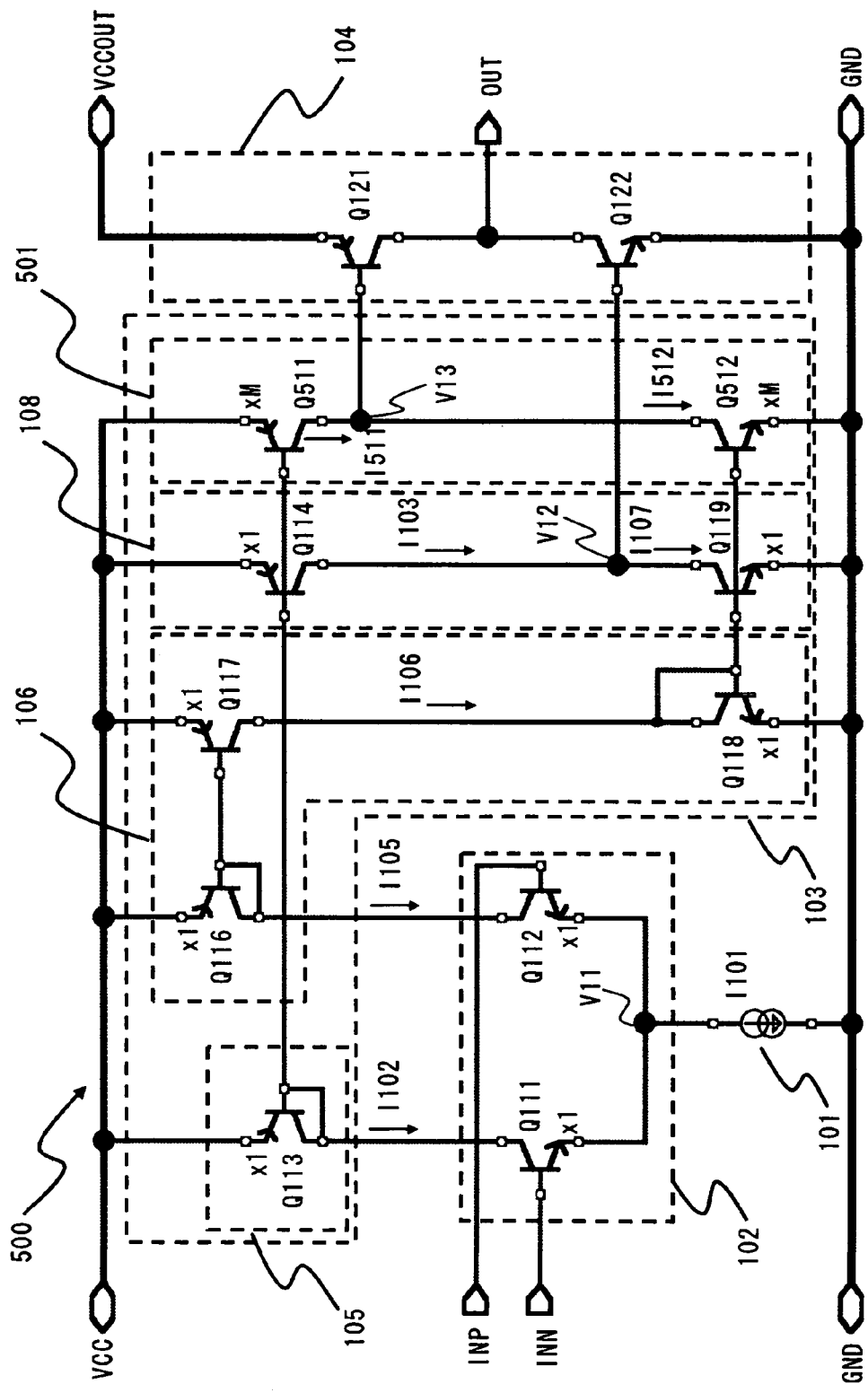
FIG. 5 is a circuit diagram showing an interface circuit according to a third embodiment of the invention.

FIG. 5 shows the circuit diagram of an interface circuit 500 according to a third embodiment of the present invention. The interface circuit 500 of the third embodiment has substantially the same configuration as the interface circuit 400 of the second embodiment. A difference is that while the first output controller 107 of the interface circuit 400 of the second embodiment has a transistor with an emitter area at a single magnification, the interface circuit 500 of the third embodiment has a transistor with an emitter area at M times magnification. The same elements as in the first embodiments are denoted by the same reference numerals and not detailed herein.

A first output controller 501 of the interface circuit 500 according to the third embodiment has a PNP transistor Q511 and an NPN transistor Q512 with emitter areas at M times magnification. Therefore, current I511 that flows through the PNP transistor Q511 is M times higher than the current I102 that flows through the first voltage generator 105. Thus, I511=M*I102. Further, current I512 that flows through the NPN transistor Q512 is M times higher than the current I106 that flows through the second voltage generator 106. Thus, I512=M*I106.

The current amplification factor of the PNP transistor is generally smaller than the current amplification factor of the NPN transistor. Thus, in order for the PNP transistor to have the same output current as the NPN transistor, the current flowing into the base of the PNP transistor needs to be higher than the current flowing into the base of the NPN transistor. For example, if the current amplification factor of the PNP transistor is ⅓ of the current amplification factor of the NPN transistor, obtaining the same current from the both transistors requires that the current flowing into the base of the PNP transistor is three times higher than the current flowing into the base of the NPN transistor.

The interface circuit 500 of the third embodiment can set the output current of the first output controller 501 to a value that is M times higher than the output current of the second output controller 108. This makes the output current of the PNP transistor Q121 closer to the output current of the NPN transistor Q122 in the output stage 104. Making the output current values of the two transistors in the output stage closer allows the rising and falling timings of the output signal to be closer. The output signal of the interface circuit 500 is thus a signal with less error.

Further, the output current of the PNP transistor Q121 of the output stage 104 increases and the output signal rises more quickly, thereby allowing still higher input signal conversion.

Fourth Embodiment

Figure 6:
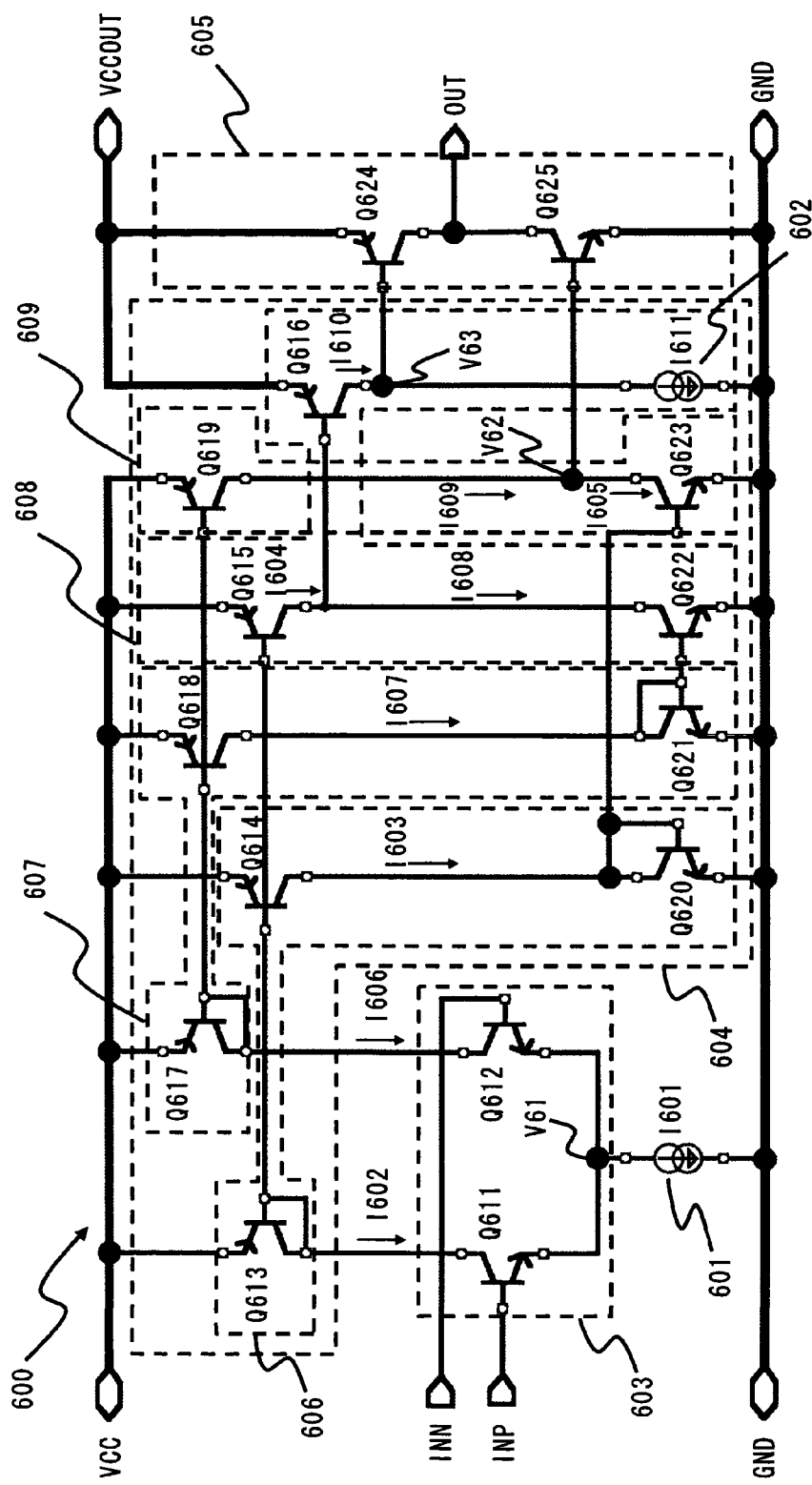
FIG. 6 is a circuit diagram showing an interface circuit according to a fourth embodiment of the invention.
Figure 7:
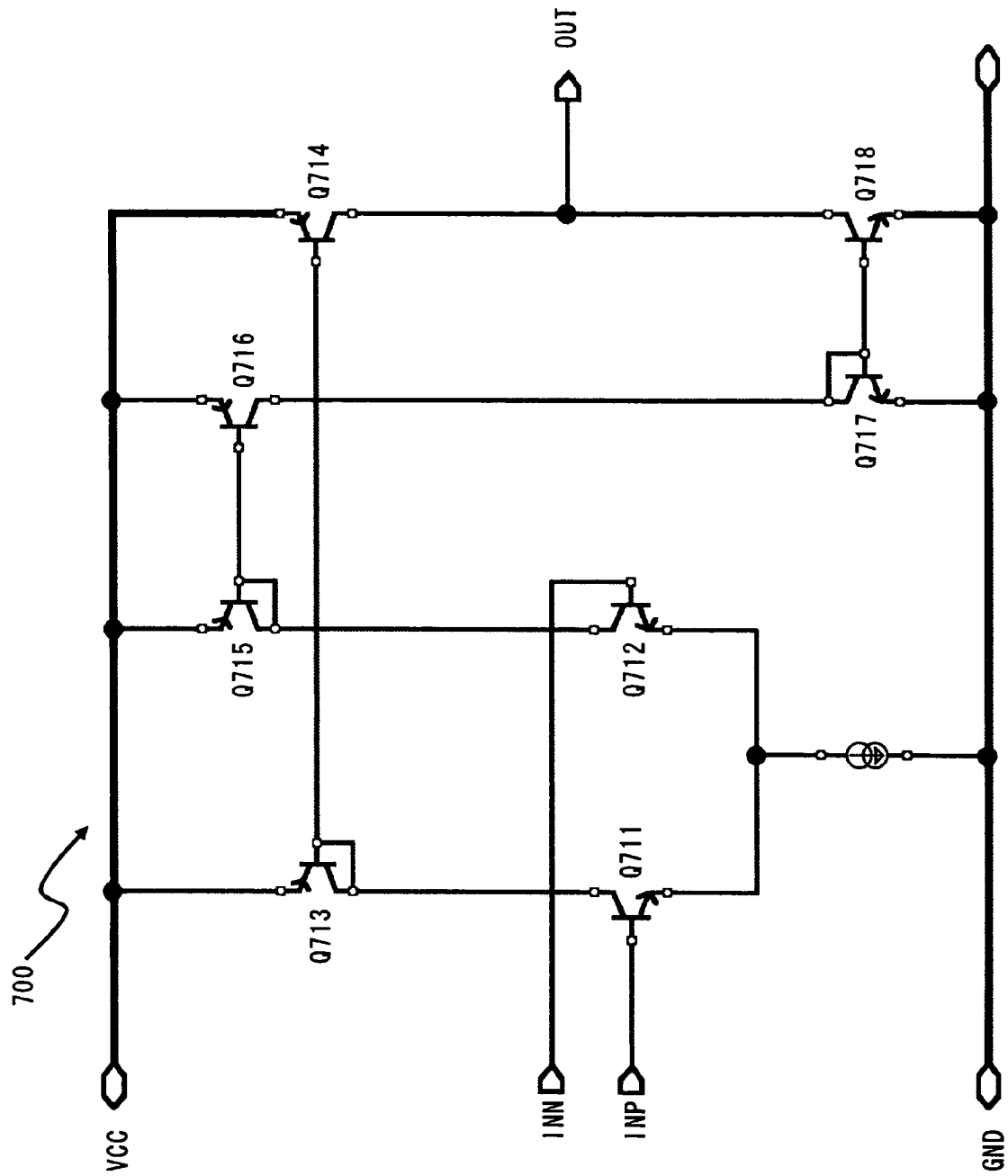
FIG. 7 is a circuit diagram showing a conventional interface circuit.

FIG. 6 shows a circuit diagram of an interface circuit 600 according to the fourth embodiment. The interface circuit 600 of the fourth embodiment includes input terminals INN and INP, an output terminal OUT, a current source 601, an input stage 603, a controller 604, and an output stage 605.

The input stage 603 has a first and a second input terminal. The first input terminal is connected to the input terminal INP, and the second input terminal is connected to the input terminal INN. The current source 601 is connected between the input stage 603 and the ground GND. The input stage 603 has a first and a second output terminal. The controller 604 has a first and a second input terminal and a first and a second output terminal. The first and the second input terminal of the controller 604 are respectively connected to the first and the second output terminal of the input stage 603. The output stage 605 has a first and a second input terminal and an output terminal. The first and the second input terminal of the output stage 605 are respectively connected to the first and the second output terminal of the controller 604. The output terminal of the output stage 605 is connected to the output terminal OUT of the interface circuit 600.

In the interface circuit 600, the input stage 603 outputs current through the first and the second output terminal according to signals input through the input terminals INP and INN. According to the output current, the controller 604 generates a control signal for controlling the output stage 605. The output stage 605 outputs an output signal according to the control signal.

The connection of the controller 604 is described below. The controller 604 includes a first voltage generator 606, a second voltage generator 607, a first output controller 608, and a second output controller 609.

The first voltage generator 606 has an input terminal and a first and a second output terminal. The input terminal is connected to the first output terminal of the input stage 603. The second voltage generator 607 has an input terminal and a first and a second output terminal. The input terminal is connected to the second output terminal of the input stage 603.

The first output controller 608 has a first and a second input terminal and an output terminal. The first input terminal is connected to the first output terminal of the first voltage generator 606. The second input terminal is connected to the second output terminal of the second voltage generator 607. The second output controller 609 has a first and a second input terminal and an output terminal. The first input terminal is connected to the first output terminal of the second voltage generator 607. The second input terminal is connected to the second output terminal of the first voltage generator 606.

The output stage 608 has a first and a second input terminal and an output terminal. The first input terminal of the output stage 608 is connected to the output terminal of the first output controller 608. The second input terminal of the output stage 608 is connected to the output terminal of the second output controller 609. The output terminal of the output stage 608 serves as the output of the interface circuit 600, to which the output terminal OUT is connected.

The connection of the components of each block is described below.

The input stage 603 includes NPN transistors Q611 and Q612. The emitter of the NPN transistor Q611 and the emitter of the NPN transistor Q612 are connected by a node V61. The current source 601 for allowing the interface circuit 600 to operate is connected between the node V61 and the first power supply (for example, the ground GND). The current source 601 supplies current I601. The base of the NPN transistor Q611 serves as the first input terminal, to which the input terminal INP is connected. The collector of the NPN transistor Q611 serves as the first output terminal of the input stage 603, which outputs current I602 according to the input INP. The base of the NPN transistor Q612 serves as the second input terminal, to which the input terminal INN is connected. The collector of the NPN transistor Q612 serves as the second output terminal of the input stage 603, which outputs current I606 according to the input INN.

The first voltage generator 606 includes PNP transistors Q613 and Q614 and an NPN transistor Q620. The PNP transistor Q613 has a base and a collector connected to each other and an emitter connected to the second power supply, which is a power supply VCC, for example. The collector of the PNP transistor Q613 serves as the input terminal of the first voltage generator 606 and is connected to the first output terminal of the input stage 603. The base of the PNP transistor Q613 outputs a voltage that is a result of subtracting a threshold voltage of the PNP transistor Q613 from the power supply voltage VCC. Thus, the base of the PNP transistor Q613 serves as the first output terminal of the first voltage generator 606. The base of the PNP transistor Q614 is connected to the base of ten PNP transistor Q613 and the emitter is connected to the power supply VCC. The collector of the PNP transistor Q614 is connected to the collector of the NPN transistor Q620. Thus, the PNP transistors Q613 and Q614 form a current mirror. The base of the NPN transistor Q620 is connected to the collector and the emitter is connected to the ground GND. The base of the NPN transistor Q620 serves as the second output terminal of the first voltage generator 606. The first voltage generator 606 outputs a threshold voltage of the NPN transistor Q620 that is generated based on current I603, which is returning current of the current I602 that has been input through the first output terminal of the input stage 603 by the current mirror of the PNP transistors Q613 and Q614.

The second voltage generator 607 includes PNP transistors Q617 and Q618 and an NPN transistor Q621. The PNP transistor Q617 has a base and a collector connected to each other and an emitter connected to the power supply VCC. The collector of the PNP transistor Q617 serves as the input terminal of the second voltage generator 607 and is connected to the second output terminal of the input stage 603. The base of the PNP transistor Q617 outputs a voltage that is a result of subtracting a threshold voltage of the PNP transistor Q617 from the power supply voltage VCC. Thus, the base of the PNP transistor Q617 serves as the first output terminal of the second voltage generator 607. The base of the PNP transistor Q618 is connected to the base of the PNP transistor Q617 and the emitter is connected to the power supply VCC. The collector of the PNP transistor Q618 is connected to the collector of the NPN transistor Q621. Thus, the PNP transistors Q617 and Q618 form a current mirror. The base of the NPN transistor Q621 is connected to the collector and the emitter is connected to the ground GND. The base of the NPN transistor Q621 serves as the second output terminal of the second voltage generator 607. The second voltage generator 607 outputs a threshold voltage of the NPN transistor Q621 that is generated based on current I607, which is returning current of the current I606 that has been input through the second output terminal of the input stage 607 by the current mirror of the PNP transistors Q617 and Q618.

The first output controller 608 includes PNP transistors Q615 and Q616, an NPN transistor Q622 and a current source 602. The emitter of the PNP transistor Q615 is connected to the power supply VCC. The first input terminal of the first output controller 608 is the base of the PNP transistor Q615, which is connected to the output terminal of the first voltage generator 606. An emitter-base voltage of the PNP transistor Q615 is substantially the same as an emitter-base voltage of the PNP transistor Q613 of the first voltage generator 606, and the PNP transistor Q615 outputs current I604 that is substantially the same as the current I602 through its collector. The emitter of the NPN transistor Q622 is connected to the ground GND. The second input terminal of the first output controller 608 is the base of the NPN transistor Q622, which is connected to the second output terminal of the second voltage generator 607. An emitter-base voltage of the NPN transistor Q622 is substantially the same as an emitter-base voltage of the NPN transistor Q620 of the first voltage generator 606, and the NPN transistor Q622 outputs current I608 that is substantially the same as the current I607 through its collector. In the first output controller 608, the collector of the PNP transistor Q615 and the collector of the NPN transistor Q622 are connected to each other, and the base of the PNP transistor Q616 is connected to the connecting point. The emitter of the PNP transistor Q616 is connected to the third power supply (e.g. output power supply VCCOUT), and the collector is connected to the ground GND through the current source 602. The output terminal of the first output controller 608 is the collector of the PNP transistor Q616. The first output controller 608 outputs a difference between the current I611 of the current source 602 and the current I610 of the PNP transistor Q616 through its output terminal according to the inputs through the first input terminal and the second input terminal.

The second output controller 609 includes a PNP transistor Q619 and an NPN transistor Q623 that are connected serially between the power supply VCC and the ground GND. The emitter of the PNP transistor Q619 is connected to the power supply VCC. The first input terminal of the second output controller 609 is the base of the PNP transistor Q619, which is connected to the first output terminal of the second voltage generator 607. An emitter-base voltage of the PNP transistor Q619 is substantially the same as an emitter-base voltage of the PNP transistor Q617 of the second voltage generator 607, and the PNP transistor Q619 outputs current I609 that is substantially the same as the current I606 through its collector. The emitter of the NPN transistor Q623 is connected to the ground GND. The second input terminal of the second output controller 609 is the base of the NPN transistor Q623, which is connected to the second output terminal of the first voltage generator 606. An emitter-base voltage of the NPN transistor Q623 is substantially the same as an emitter-base voltage of the NPN transistor Q620 of the second voltage generator 607, and the NPN transistor Q623 outputs current I605 that is substantially the same as the current I603 through its collector. In the second output controller 609, the collector of the PNP transistor Q619 and the collector of the NPN transistor Q623 are connected to each other. The second output controller 609 outputs a difference between the current I609 and the current I605 through the connecting point.

The output stage 608 includes a PNP transistor Q624 and an NPN transistor Q625 that are connected serially between the output power supply VCCOUT and the ground GND. The emitter of the PNP transistor Q624 is connected to the output power supply VCCOUT. The base of the PNP transistor Q624 serves as the first input terminal of the output stage and is connected to the output terminal of the first output controller 608. The emitter of the NPN Transistor Q625 is connected to the ground GND. The base of the NPN Transistor Q625 serves as the second input terminal of the output stage and is connected to the output terminal of the second output controller 609. The collector of the PNP transistor Q624 and the collector of the NPN Transistor Q625 are connected to each other, and their connection point serves as the output of the interface circuit 600, to which the output terminal OUT is connected.

The operation of the interface circuit 600 according to the fourth embodiment is described hereinafter. Firstly, the case where the input INP is lower level than the input INN is as follows. The NPN transistor Q611 of the input stage 603 is in the shutoff state and the NPN transistor Q612 is in the saturated state. The current corresponding to the current I601 from the current source 601 thereby flows as the current I606. The current I602 is substantially zero.

The current that is substantially the same as the current I606 flows as the current I607, I608 and I609. The current I603, I604 and I605 are substantially the same as the current I602, which is zero.

Thus, the current I608 flows out from the base of the PNP transistor Q616 of the first output controller 608. At this time, the PNP transistor Q616 is in the saturated state and the current that is substantially the same as the current I611 from the current source 602 flows therethrough. Thus, no current is supplied to the output of the first output controller 608. Since the PNP transistor Q616 is in the saturated state, the voltage at the output of the first output controller 608 increases to the output power supply voltage VCCOUT.

According to the output of the first output controller 608, the PNP transistor Q624 of the output stage 608 becomes in the saturated state.

The second output controller 609 outputs a difference between the current I609 and the current I605 through its output terminal. Thus, the current I609 is output through the output terminal of the second output controller 609.

According to the output from the second output controller 609, the NPN transistor Q625 of the output stage 608 becomes in the saturated state. Thus, the current amplified from the current I609 flows therethrough, and the output voltage is Low level (e.g. the ground voltage GND).

Then, the case where the input INP is higher than the input INN is described. In this case, the NPN transistor Q611 of the input stage 603 is in the saturated state and the NPN transistor Q612 is in the shutoff state. The current corresponding to the current I601 from the current source 601 thereby flows as the current I602. The current I606 is substantially zero.

The current that is substantially the same as the current I602 flows as the current I603, I604 and I605. The current I607, I608 and I609 are substantially the same as the current I606, which is zero.

The PNP transistor Q615 of the first output controller 608 is thus in the saturated state, and the base voltage of the PNP transistor Q616 equals the power supply voltage VCC. The PNP transistor Q616 becomes in the saturated state and no current flows therethrough. Thus, the output of the first output controller 608 tries to take in the current I611.

According to the output of the first output controller 608, the current I611 flows out of the base of the PNP transistor Q624 of the output stage 608. The PNP transistor Q624 thereby becomes in the saturated state, and the current amplified from the current I611 flows therethrough. At this time, the output terminal becomes High level (e.g. the output power supply voltage VCCOUT).

Since the NPN transistor Q623 of the second output controller 609 is in the saturated state, the voltage at the output terminal equals the ground voltage GND.

According to the output of the second output controller 609, the NPN transistor Q625 of the output stage 608 becomes in the shutoff state.

The interface circuit 600 of the fourth embodiment sets an output power supply voltage VCCOUT that is different from the power supply voltage VCC with which the interface circuit 600 operates, thereby allowing the level after signal level conversion to be set with high freedom degree just like the second embodiment.

Further, the fourth embodiment has the current source 602 in the first output controller 608. The PNP transistor Q624 of the output stage 608 operates with the current from the current source 602. Thus, even if a current amplification factor differs between the NPN transistor and the PNP transistor, the base current supplied to the PNP transistor for operation can be set freely with the current source 602. This allows equalizing the current capacity of the NPN transistor and the PNP transistor of the output stage 608. It is thereby possible to make the rising and falling timings of the output signal to be closer, thus producing a highly accurate output signal.

The settings of the current source 601 for the operation of the interface circuit 600 of the fourth embodiment can be determined based on the base current that is sufficient for the operation of the NPN transistor of the output stage. Thus, the interface circuit 600 of the fourth embodiment also allows the reduction of circuit power consumption just like the first embodiment.

The present invention is not restricted to the above embodiments but may be varied in many ways as long as the invention controls a transistor of an output stage with flow-in or flow-out of the base current of the transistor. For example, a current source used for the operation of an interface circuit may be connected through the side of a power supply voltage VCC.

It is apparent that the present invention is not limited to the above embodiment that may be modified and changed without departing from the scope and spirit of the invention.

What is claimed is:

1. An interface circuit comprising:
    a first input terminal;
    a second input terminal;
    a first output transistor;
    a second output transistor;
    a first output controller for implementing control according to a voltage supplied to the first and the second input terminals so that a first predetermined current appears at a control terminal of the first output transistor if the first output transistor is in a saturated state and supplies a second predetermined current to the control terminal of the first output transistor if the first output transistor is in a shutoff state; and
    a second output controller for implementing control according to a voltage supplied to the first and the second input terminals so that a third predetermined current appears at a control terminal of the second output transistor if the second output transistor is in a saturated state and supplies a fourth predetermined current to the control terminal of the second output transistor if the second output transistor is in a shutoff state.

2. The interface circuit according to claim 1, comprising:
a first transistor connected to the first input terminal, for outputting a current according to a voltage at the first input terminal;
a first voltage generator for outputting a voltage according to an output of the first transistor;
a second transistor connected to the second input terminal, for outputting a current according to a voltage at the second input terminal; and
a second voltage generator for outputting a voltage according to an output of the second transistor.

3. The interface circuit according to claim 2, wherein the first output controller implements control according to outputs of the first and the second voltage generator so that the first predetermined current appears at a control terminal of the first output transistor if the first transistor is in the saturated state and supplies the second predetermined current to the control terminal of the first output transistor if the first transistor is in the shutoff state.

4. The interface circuit according to claim 2, wherein the second output controller implements control according to outputs of the first and the second voltage generator so that the third predetermined current appears at a control terminal of the second output transistor if the second transistor is in the saturated state and supplies the fourth predetermined current to the control terminal of the second output transistor if the second transistor is in the shutoff state.

5. The interface circuit according to claim 2, wherein the first voltage generator comprises a third transistor for generating a voltage according to a current generated according to an input of the first transistor.

6. The interface circuit according to claim 2, wherein the second voltage generator comprises a fourth transistor for generating a voltage according to a current generated according to an input of the second transistor.

7. The interface circuit according to claim 1, wherein the first and the second output transistors are connected serially between a first power supply and a second power supply or a third power supply.

8. The interface circuit according to claim 1, wherein the first output controller comprises a fifth transistor and a sixth transistor that are connected serially between a first power supply and a second power supply.

9. The interface circuit according to claim 8, wherein the first output controller comprises a seventh transistor and a second current source that are connected serially between the first power supply and a third power supply.

10. The interface circuit according to claim 1, wherein the second output controller comprises a seventh transistor and an eighth transistor that are connected serially between a first power supply and a second power supply.

11. The interface circuit according to claim 1, wherein the first output controller implements control so that the first predetermined current appears at a control terminal of the first output transistor if the first transistor is in the saturated state and supplies the second predetermined current to the control terminal of the first output transistor if the first transistor is in the shutoff state according to outputs of a first transistor connected to the first input terminal and outputting a current according to a voltage at the first input terminal and a first voltage generator for outputting a voltage according to an output of the first transistor, and a second transistor connected to the second input terminal and outputting a current according to a voltage at the second input terminal and a second voltage generator for outputting a voltage according to an output of the second transistor.

12. The interface circuit according to claim 1, wherein the second output controller implements control so that the third predetermined current appears at the control terminal of the second output transistor if the second transistor is in the saturated state and supplies the fourth predetermined current to the control terminal of the second output transistor if the second transistor is in the shutoff state according to outputs of a first transistor connected to the first input terminal and outputting a current according to a voltage at the first input terminal and a first voltage generator for outputting a voltage according to an output of the first transistor, and a second transistor connected to the second input terminal and outputting a current according to a voltage at the second input terminal and a second voltage generator for outputting a voltage according to an output of the second transistor.

13. The interface circuit according to claim 1, wherein said first output transistor and said second output transistor comprise bipolar transistors.

14. The interface circuit according to claim 2, wherein said first transistor and said second transistor comprise bipolar transistors.

15. The interface circuit according to claim 1, wherein a signal input to said control terminal of said first transistor and a signal input to said control terminal of said second transistor are the same in phase, and a signal input to said control terminal of said first transistor and a signal input to said control terminal of said second transistor are different in voltage level.

16. A level conversion circuit, comprising:
a first input bipolar transistor receiving a first input signal;
a second input bipolar transistor receiving a second input signal;
a first output bipolar transistor being driven in phase with said first input bipolar transistor;
a second output bipolar transistor being driven in phase with said second input bipolar transistor; and
a first output controller that provides a stable drive current to a base of said first output bipolar transistor when said first input bipolar transistor is in a shutoff state.

17. The level conversion circuit of claim 16, wherein said first output controller provides a drive current to said first output bipolar transistor so that said first output bipolar transistor smoothly transitions to said shutoff state.

18. The level conversion circuit of claim 17, further comprising:
a second output controller that provides a stable drive current to said second output bipolar transistor when said second input bipolar transistor is in a shutoff state and during transitions to said shutoff state.

19. The level conversion circuit of claim 16, wherein said input signal comprises an Emitter Coupled Logic (ECL) level and an output level of said first and second output bipolar transistors comprises a Complementary Metal Oxide Semiconductor (CMOS) level.

20. The level conversion circuit of claim 16, wherein said first input bipolar transistor
and said first output bipolar transistor operate from a different power supply.

* * * * *